United States Patent
Hu et al.

(10) Patent No.: US 9,151,813 B2
(45) Date of Patent: Oct. 6, 2015

(54) HIGH-PRESSURE, HIGH-TEMPERATURE MAGIC ANGLE SPINNING NUCLEAR MAGNETIC RESONANCE DEVICES AND PROCESSES FOR MAKING AND USING SAME

(71) Applicants: Jian Zhi Hu, Richland, WA (US); Mary Y. Hu, Richland, WA (US); Mark R. Townsend, Kennewick, WA (US); Johannes A. Lercher, Ottobrunn (DE); Charles H. F. Peden, West Richland, WA (US)

(72) Inventors: Jian Zhi Hu, Richland, WA (US); Mary Y. Hu, Richland, WA (US); Mark R. Townsend, Kennewick, WA (US); Johannes A. Lercher, Ottobrunn (DE); Charles H. F. Peden, West Richland, WA (US)

(73) Assignee: BATTELLE MEMORIAL INSTITUTE, Richland, WA (US)

( * ) Notice: Subject to any disclaimer, the term of this patent is extended or adjusted under 35 U.S.C. 154(b) by 0 days.

(21) Appl. No.: 13/961,012

(22) Filed: Aug. 7, 2013

(65) Prior Publication Data
US 2014/0044598 A1    Feb. 13, 2014

Related U.S. Application Data

(60) Provisional application No. 61/680,958, filed on Aug. 8, 2012.

(51) Int. Cl.
*G01R 33/30* (2006.01)
*B23G 1/02* (2006.01)
*G01R 3/00* (2006.01)

(52) U.S. Cl.
CPC .............. *G01R 33/305* (2013.01); *B23G 1/02* (2013.01); *G01R 3/00* (2013.01); *G01R 33/307* (2013.01); *Y10T 29/49996* (2015.01); *Y10T 409/300112* (2015.01)

(58) Field of Classification Search
CPC ..... G01R 33/30; G01R 33/302; G01R 33/305
See application file for complete search history.

(56) References Cited

U.S. PATENT DOCUMENTS

| | | | | |
|---|---|---|---|---|
| 3,585,301 A * | 6/1971 | Newman | ..................... | 175/300 |
| 5,325,059 A | 6/1994 | Doty | | |
| 5,333,994 A | 8/1994 | Doty et al. | | |
| 6,054,857 A * | 4/2000 | Doty | ......................... | 324/321 |
| 2012/0146636 A1 | 6/2012 | Hoyt et al. | | |

OTHER PUBLICATIONS

Hoyt, D. W., et al., High-pressure magic angle spinning nuclear magnetic resonance, Journal of Magnetic Resonance, 212, 2011, 378-385.

(Continued)

*Primary Examiner* — Paul Hyun
(74) *Attorney, Agent, or Firm* — James D. Matheson

(57) ABSTRACT

Re-usable ceramic magic angle spinning (MAS) NMR rotors constructed of high-mechanic strength ceramics are detailed that include a sample compartment that maintains high pressures up to at least about 200 atmospheres (atm) and high temperatures up to about least about 300° C. during operation. The rotor designs minimize pressure losses stemming from penetration over an extended period of time. The present invention makes possible a variety of in-situ high pressure, high temperature MAS NMR experiments not previously achieved in the prior art.

7 Claims, 16 Drawing Sheets

(56) References Cited

OTHER PUBLICATIONS

Turcu, R. V. F, et al., Rotor design for high pressure magic angle spinning nuclear magnetic resonance, Journal of Magnetic Resonance, 226, 2013, 64-69.

International Search Report/Written Opinion for International Application No. PCT/US2013/054171, International Filing Date Aug. 8, 2013, Date of Mailing Jan. 24, 2014.

* cited by examiner

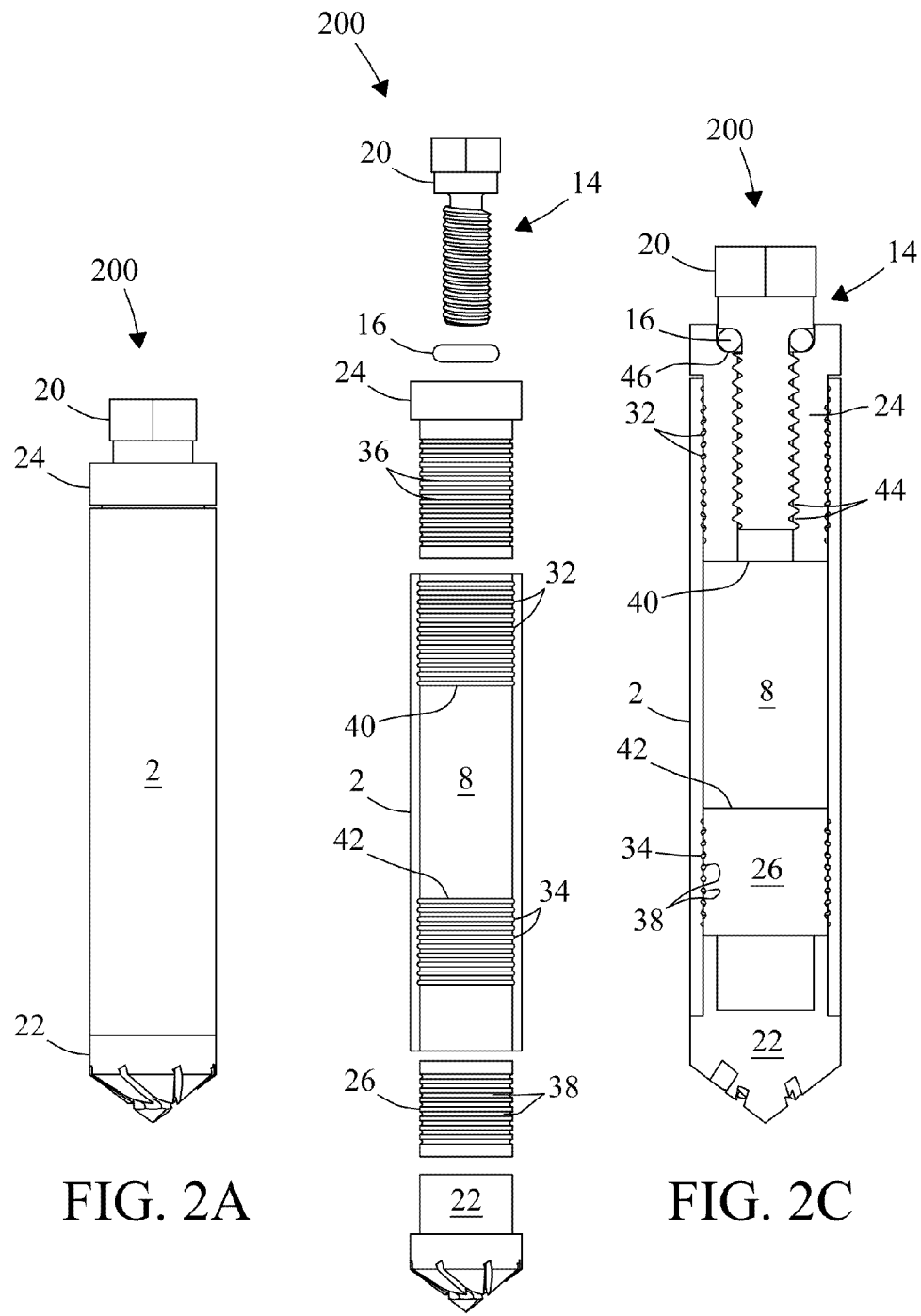

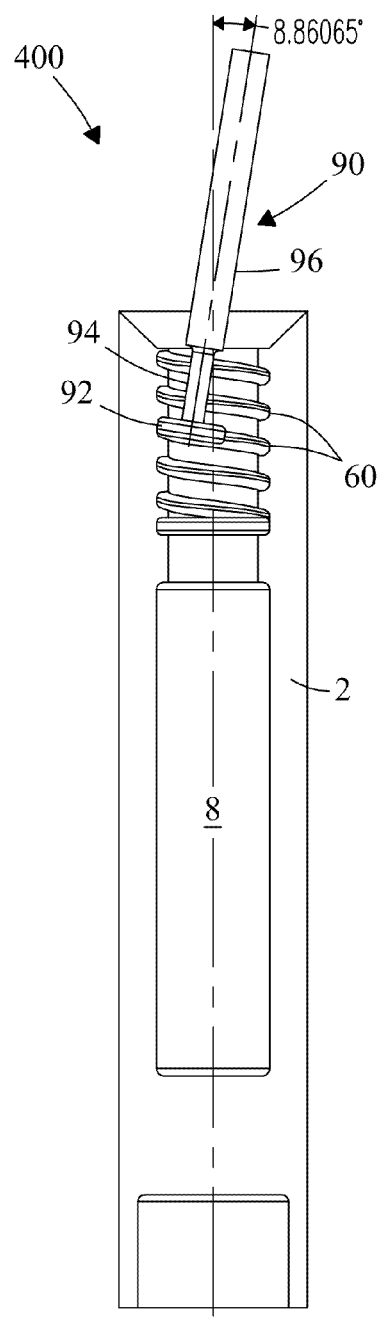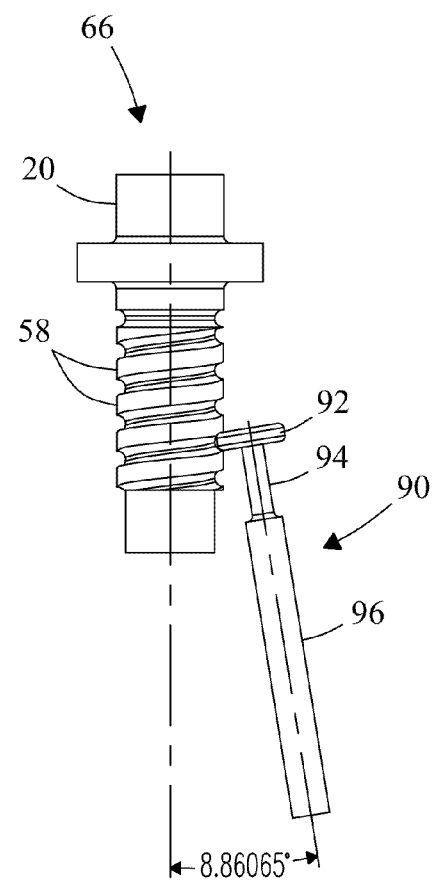
FIG. 7C
FIG. 7D

HIGH-PRESSURE, HIGH-TEMPERATURE MAGIC ANGLE SPINNING NUCLEAR MAGNETIC RESONANCE DEVICES AND PROCESSES FOR MAKING AND USING SAME

CROSS REFERENCE TO RELATED APPLICATION

This application is a non-provisional application that claims priority from U.S. Provisional Application No. 61/680,958 entitled "Devices for Combined High Temperature and High Pressure Magic Angle Spinning Nuclear Magnetic Resonance", filed 8 Aug. 2012, which reference is incorporated herein in its entirety.

STATEMENT REGARDING RIGHTS TO INVENTION MADE UNDER FEDERALLY-SPONSORED RESEARCH AND DEVELOPMENT

This invention was made with Government support under contract DE-AC05-76RLO1830 awarded by the U.S. Department of Energy, and the National Institute of Environmental Health Sciences under contract R01ES022176 awarded by the National Institutes of Health. The Government has certain rights in the invention.

FIELD OF THE INVENTION

The present invention relates generally to magic angle spinning (MAS) nuclear magnetic resonance (NMR) devices for spectroscopy. More particularly, the present invention relates to combined high-pressure, high temperature magic angle spinning rotors and processes for machining ceramic components of rotors for high-pressure, high temperature magic angle spinning nuclear magnetic resonance spectroscopy.

BACKGROUND OF THE INVENTION

High resolution magic angle spinning (MAS) nuclear magnetic resonance (NMR) spectroscopy is a powerful and versatile technique for studying molecular structure and dynamics in solid systems, semi-solid systems, or heterogeneous systems containing mixtures of e.g., solid, semi-solid, liquid, and gaseous phases. Thus MAS NMR is an attractive tool for in-situ investigations of reaction dynamics and intermediates, investigations of properties of active sites in catalysts during catalytic conversion of biogenic molecules in aqueous phase water, and physical/chemical properties and/or phase transitions in materials and material syntheses. However, reusable sample cells that perform well at temperatures greater than about 100° C. and pressures greater than the vapor pressure of aqueous water have not been realized in MAS NMR to date due primarily to technical difficulties associated with sealing heterogeneous fluid samples at high temperature and high pressure conditions that would prevent leakage of fluids while spinning samples at a spinning rate of several kHz or more inside a strong magnetic field. To date, MAS NMR experiments have been performed at pressures of about 150 bar and temperatures up to 80° C. using a zirconia rotor sleeve and plastic components including bushings, O-rings, valves, and valve adaptors detailed, e.g., by Hu et al. in "High-Pressure Magic Angle Spinning Nuclear Magnetic Resonance", *J. Magn. Reson.*, 212, 378-385 (2011); Hu et al. in "Rotor Design for High Pressure Magic Angle Spinning Nuclear Magnetic Resonance", *J. Magn. Reson.*, 226, 64-69 (2012); and US Patent Publication No.: 2012/0146636. However, plastic components soften at higher temperatures, rendering previous designs unsuitable at temperatures above 100° C. Accordingly, new rotor designs are needed that provide sealing of heterogeneous fluid samples at high temperature and high pressure conditions and prevent leakage of fluids while spinning samples at spinning rates of several kHz or more inside strong magnetic fields. The present invention addresses these needs.

SUMMARY OF THE INVENTION

The present invention includes new high temperature and high pressure Magic Angle Spinning (MAS) rotors that generate high-resolution NMR spectra in operation at high pressures and high temperatures. These exemplary new designs make a variety of combined high temperature and high pressure MAS NMR experiments possible that were previously not possible. Exemplary MAS rotors are detailed herein with outside diameters (O.D.) of 9.5 mm, 7.5 mm, and 5 mm, respectively. However, rotor diameters are not limited. For example, rotors with O.D. dimensions greater than 9.5 mm and less than 5 mm may be fabricated as detailed herein including rotors with outside diameters of, e.g., 4 mm, 3.2 mm, or smaller diameters, albeit with increasing fabrication difficulty as dimensions decrease. The MAS rotors are reusable and provide $^{13}C$ background-free operation at temperatures at least up to 300° C. and pressures at least up to 200 atmospheres or greater. When sealed, the rotor maintains a selected high pressure and high temperature within the sample cell without release of fluids and gases from the materials therein. The new capability makes possible a variety of high temperature and high pressure MAS NMR analyses and experiments that were previously impossible including, e.g., in situ MAS NMR analyses of reactions, materials, fluids, and gases.

Rotor volumes are not limited. Dimensions of the rotor determine the possible volumes that can be used. Thus, no limitations are intended by the description of exemplary embodiments disclosed herein. In some applications, volumes may be at least up to about 75 µL. In some applications, volumes may be up to about 250 µL. In some applications, volumes may be up to about 500 µL. In some applications, volumes may be up to about 750 µL or greater.

In one design, the MAS rotor may include a reusable rotor cylinder composed of a ceramic such as zirconia. In some applications, the rotor cylinder may include a width dimension (O.D.) of 9.5 mm with a smooth inner surface along the length of the inner wall. A rotor sleeve insert, e.g., with a cylindrical shape and a single opening at a top end of the insert may be introduced into the rotor cylinder along the length of the inner wall of the rotor cylinder. The rotor sleeve insert may be made of a machinable glass ceramic such as MACOR® (Corning Glass Inc., Corning, N.Y., USA) composed of fluorphlogopite mica in a borosilicate glass matrix, or other suitable materials. When introduced into the rotor cylinder, the rotor sleeve insert may form a sample compartment into which samples may be introduced and sealed in the MAS rotor. The rotor sleeve insert may be secured inside the rotor cylinder with a thin layer of a high strength, high temperature glue such as Aremco-Bond 631-B-1108 epoxy (Aremco Products, Inc., New York, N.Y., USA) positioned between the outer surface of the rotor sleeve insert and the inner wall of the rotor cylinder that prevents release of the rotor sleeve insert from the rotor cylinder during sample spinning. In the instant design, since the sample compartment is inside the rotor sleeve insert, sample does not contact or react with the high temperature glue during operation of the rotor. The sample compartment may include a volume defined by the depth of the inner bore within the ceramic insert with an inner diameter that spans the diameter of the ceramic insert less the wall thickness of the ceramic insert surrounding the sample compartment. Sample compartment volumes are not intended to be limited. In one embodiment, the exemplary 9.5 mm rotor has a sample compartment that may hold a sample volume of at least up to about ~250 µL. Threads may be machined into the rotor sleeve insert from the opening at the top of the ceramic insert along the length of the inner wall to the top of the sample compartment. A threaded sealing (screw) cap may be introduced into the opening at the top of the ceramic insert through a high-temperature O-ring. The screw cap when screwed into screw threads of the ceramic insert above the sample compartment compresses the high-temperature O-ring or other gasket onto a platform or support machined at the top end of the ceramic insert that seals samples within the sample compartment. Screw cap may be made of a high temperature and high pressure plastic such as polyether ether ketone (PEEK), a high-performance polyimide-based plastic (VESPEL), or a high-performance polyamide-imide (TORLON) and like plastics, but plastics are not intended to be limited. The screw cap may include heads of various shapes. In some applications, the sealing cap may include an exposed head or an embedded socket head of a selected shape. In some applications, the screw cap may include a hexagonal-shaped head that assists rotation into threads of the ceramic insert that seals the sample compartment. O-rings that seal the sample compartment may be composed of, e.g., a perfluoroelastomer suited for high temperatures and high pressure applications. O-rings may be positioned at various locations in the sample rotor that eliminate softening problems observed in conventional rotors at elevated temperatures and pressures. The exemplary design allows combined high temperatures at least up to about 250° C. and high pressures at least up to about 10 atm during operation.

In another exemplary design, the MAS rotor may include a reusable rotor cylinder constructed from a ceramic such as zirconia. In some applications, the rotor cylinder may include an outer diameter (O.D.) of 9.5 mm. However, diameters are not intended to be limited. The rotor cylinder may include circular grooves or a roughened surface machined along the length of the inner wall above and below the position selected for the sample compartment in the rotor cylinder. The circular grooves may be configured to hold a thin layer of a high strength, high temperature glue such as Aremco-Bond 631-B-1108 epoxy (Aremco Products, Inc., New York, N.Y., USA). Two ceramic plugs made of a machinable ceramic such as MACOR® may be introduced through openings at respective ends of the rotor cylinder. Circular grooves may be machined on the exterior surface of the ceramic plugs. High temperature glue may be applied to fill the grooves on the exterior surface of the ceramic plugs which secures the ceramic plugs in position adjacent grooves positioned along the inner surface of the rotor cylinder. The upper (top) plug forms the ceiling of the sample compartment. The lower (bottom) ceramic plug is a solid component that when introduced at the bottom of the rotor cylinder near the spin tip forms the floor of the sample compartment. The upper (top) plug may include an opening at the top end of the plug with a central bore of a selected depth with threads positioned along the inner wall therein and a platform positioned at the top end of the plug for mounting a high temperature O-ring. Volumes of the sample compartment are not limited. Volumes of the sample compartment may be defined by the position of the ceramic plugs in the rotor cylinder and the internal diameter of the rotor cylinder. Thus, various volumes may be selected. Volumes of the instant design may be larger than those of rotors that employ a ceramic insert to form the sample compartment. A threaded screw cap constructed of a high mechanical strength, high temperature plastic such as, e.g., PEEK®, VESPEL® or TORLON® may be introduced through a high temperature O-ring into the opening at the top end of the upper ceramic plug and screwed into the threads of the ceramic plug above the sample compartment. The screw cap when threaded into position compresses a high-temperature O-ring that seats onto the O-ring support at the top end of the ceramic plug and seals a sample within the sample compartment. The sealing cap may include an exposed head or an embedded socket head of a selected shape. In some applications, the screw cap may include a hexagonal-shaped head that assists rotation into threads of the ceramic plug and seals the sample compartment, but shapes are not limited. The O-ring that seals the sample compartment may be composed of, e.g., a perfluoroelastomer suited for high temperature and high pressure applications. The exemplary design is suitable for high temperatures at least up to about 250° C. and high pressures at least up to about 10 atm during operation.

In yet another design, the MAS rotor may include a reusable rotor cylinder constructed of a high mechanical strength ceramic. High mechanical strength ceramics include, but are not limited to, cubic crystalline zirconium dioxide ($ZrO_2$) (also known as zirconia), sapphire (a crystalline aluminum oxide, i.e., α-Al2O3), silicon carbide (SiC), silicon nitride (Si3N4), and like materials. In these designs, the high mechanical strength ceramics are machined using custom-designed diamond grinding or cutting tools. Hardness of the zirconia ceramic requires new machining tools and machining methods for fabricating the rotor described further herein. The rotor cylinder may be machined from a single block of zirconia. Width (O.D.) dimensions are not limited. For example, rotors with the instant design may include various sizes employed in the NMR art. In general, the larger the diameter, the easier the machining and the lower the cost of machining. The rotor cylinder may include an opening at the top end of the rotor cylinder. The rotor cylinder may include a beveled edge or well that surrounds the opening at the top end of the rotor cylinder and defines an O-ring or gasket support. The rotor cylinder includes an inner bore machined to a selected depth that defines the sample compartment. The rotor cylinder may include screw threads that extend from the opening at the top end of the rotor cylinder along the length of the inner wall above the sample compartment. In the instant design, the sample compartment is integrated with the rotor cylinder. Volume of the sample compartment is selected by the depth of the inner bore and the inner diameter of the rotor cylinder that defines the sample compartment. Thus, various volumes for the sample compartment may be selected. No limitations are intended. A threaded ceramic screw cap constructed of a high mechanical-strength ceramic such as zirconia may be introduced through a high temperature O-ring into the opening at the top end of the rotor cylinder. The screw cap when screwed into position at the top end of the rotor cylinder compresses the high-temperature O-ring onto an O-ring support surrounding the opening that seals a sample within the sample compartment. The ceramic screw cap forms the ceiling of the sample compartment and determines the final volume of the sample compartment. In various applications, the ceramic screw cap may include an exposed head or an embedded socket head of a selected shape. In some applications, the ceramic screw cap may include a hexagonal-shaped head that assists rotation into the threads of the rotor cylinder that seals the sample compartment, but shapes are not limited. In the instant design, sealing of the sample compartment may be achieved without high-temperature glue.

In another design, the ceramic screw cap may seat at least two O-rings, a first O-ring located, e.g., at a lower end near the tip of the ceramic screw cap that seats immediately above the sample compartment in the rotor cylinder and a second O-ring that seats on the O-ring support positioned at the top end of the rotor cylinder. In various applications, the ceramic screw cap may include an exposed head or an embedded socket head of a selected shape. In some applications, the ceramic screw cap may include a hexagonal-shaped head that assists rotation into the threads of the rotor cylinder that seals the sample compartment. Shapes are not limited. The instant designs currently allow combined temperatures of at least about 300° C. and pressures at least up to about 200 atm during operation.

Spin tips for MAS rotors described herein may be constructed of machinable plastics such as polychlorofluoropolymers such as polychlorofluorethylene (PTCFE) sold commercially under the tradename KEL-F® (3M Corp., St. Paul, Minn., USA], or like materials.

The present invention also includes a process for machining high mechanical strength ceramic components with selected tolerances suitable for high pressure and high temperature MAS NMR rotors. The process may include milling an exterior surface and an inner bore of a ceramic rotor cylinder with a diamond milling tool. The process may also include milling interior and exterior threads of the rotor cylinder and external threads of a ceramic sealing cap with a diamond milling tool. The process may also include milling a head of a selected shape at an end of the ceramic sealing cap with a diamond milling tool. The process may include turning the ceramic components in a turning lathe at a selected RPM, and grinding (or milling) the ceramic with a custom-designed diamond grinding (e.g., Burrs) or rotary milling tool aligned parallel to the axis of the ceramic component at a selected offset (cutting or grinding) distance at a selected RPM. The milling may be performed iteratively to remove a selected thickness of the ceramic from the ceramic components that serves to machine the ceramic component. Machining a rotor cylinder or a threaded screw cap may proceed from a solid piece of the high mechanical strength ceramic that achieves diameters up to about 15 mm or greater or diameters as small as 1.0 mm. Machining the inner bore of the rotor cylinder may be performed iteratively at an offset that increases the diameter of the inner bore, e.g., by about 0.0005 inches (0.13 mm) per cycle (pass). As an example, in one exemplary component, a 9.5 mm O.D. high temperature, high pressure MAS NMR rotor cylinder may be machined to achieve a final bore diameter of about 0.216 inches (5.49 mm) and a final bore depth of about 1.07 inches (2.72 cm). Machining the inner bore may include grinding a starting bore to the desired depth and to a first selected diameter of, e.g., 0.206 inches (5.23 mm) with the grinding tool while rotating the ceramic block at a selected RPM and at a selected offset, then increasing the bore diameter iteratively, e.g., to about 0.214 inches (5.44 mm), then to about 0.215 inches (5.46 mm), and then to the final bore diameter of about 0.216 inches (5.49 mm). In some applications, the rotor cylinder may include a diameter of about 0.50 inches (1.27 cm) and a length of about 1.75 inches (4.45 cm).

The process crafts selected ceramic components at selected tolerances suitable for operation at high pressure, high temperature conditions and applications.

Outer diameters are not limited. In various applications, the MAS rotor cylinder may include an outer diameter of, e.g., 9.5 mm, 7.5 mm, 6 mm, 4 mm, 3.2 mm, and 1.6 mm.

In various applications, the grinding tool may operate at an RPM selected between about 10,000 RPM and about 40,000 RPM or greater, but rotation speeds are not limited. RPM of the turning lathe may be selected at or below 100 RPM, but rotation speeds are not limited. In some applications, the screw cap may be rotated at a speed of about 20 revolutions per minute (RPM) and machined with the grinding tool at an offset distance of about 0.0005 inches (1.3 mm) per revolution In various applications, the grinding tool may be positioned at any selected axis offset distances (i.e., an offset distance from axis, or a grinding or a cutting distance) that achieves a selected bore depth and a selected diameter within the ceramic rotor cylinder or other ceramic component. In some applications, the axis offset may be about 0.040 inches (1.02 mm). However, offset values are not limited. The offset distance permits the diamond tool to cool efficiently and provides efficient removal of ceramic powders from the inner bore that are generated as the tool grinds the ceramic. The exterior surface of the ceramic rotor cylinder may be ground with the diamond grinding tool while the ceramic block being machined is rotated in the turning lathe. Any suitable offset and suitable RPMs may be used to machine the surface of the ceramic block and attain the selected outer diameter (O.D.).

The machining process may further include cutting threads of a selected type in the rotor cylinder at selected positions along the inner wall, e.g., at an end above the sample compartment. Position of the threads is not limited. Cutting threads may be performed with a customer-made diamond tool described further herein. Thread shapes and thread angles are not limited.

Thread shapes in the rotor cylinder and in other components are not limited. Thread shapes depend in part on the shape of the heads of the diamond grinding tools used to machine the threads. In some applications, threads may be of a modified sharp V screw thread design. The sharp V screw thread may be modified to include rounded inner corners with a thread angle (arc size) of, e.g., 60 degrees that increase the strength of the threads in the rotor cylinder that minimizes cracks in the ceramic during high pressure, high temperature operation.

Milling the modified sharp-V screw threads may include milling with a diamond milling head of the diamond tool that has a milling angle of 60 degrees and is further tilted at an angle equal to the offset angle.

In some applications, threads may be of a generally U-shaped screw thread design such as a rounded square or rounded rectangle in which sharp corners of the square or rectangle are rounded to increase the strength of the threads in the ceramic. Arc sizes are not limited.

As an example, in the exemplary 9.5 mm (O.D.) high temperature, high pressure MAS NMR rotor cylinder or other ceramic components, threads may be cut into the ceramic component with a diamond grinder positioned at an axis offset of about 6.602 degrees relative to the wall of the rotor cylinder to create a selected density of threads or a selected pitch distance between any two adjacent threads introduced into the ceramic component. However, dimensions, density, and pitch distances are not limited. For example, offset angles, thread densities, and pitch distances depend in part on sizes of the individual ceramic components and dimensions of, e.g., the inner bore. Thus, no limitations are intended by any of the exemplary dimensions. In various applications, offset angles may be defined by the selected pitch distance of the interior and exterior threads of the rotor cylinder and the diameter of the inner bore of the rotor cylinder; or the pitch distance of the exterior threads of the ceramic sealing cap and the outer diameter of the ceramic sealing cap. In some applications, the thread density may be about 16 threads per inch (6.30 threads per cm). In addition, offset angles may be selected that avoid heating of the ceramic components during the machining and that provide the modified sharp V-shaped threads, and/or U-shaped (e.g., rectangular or square) threads.

In some applications, threads may include a thread direction that is the same as the direction of rotation of the rotor during operation to prevent loosening of the ceramic sealing cap stemming from release of gases from the sample compartment during operation.

In some applications, threads may include a thread direction that is opposite the direction of rotation of the rotor during operation.

The process may include machining one end of the rotor cylinder to form an O-ring support. Angles of the O-ring support are not limited provided the support effectively seats the O-ring and seals the sample compartment when the screw cap is screwed into position in the rotor cylinder. In some applications, the O-ring support may include a 45 degree angle.

In some applications, the ceramic component may be a threaded screw cap. The screw cap may be machined with the grinding tool to achieve a selected external diameter and a selected length. Diameter and length dimensions are not limited. Threads of the screw cap may be machined so that they match threads machined along the inner wall of the rotor cylinder. In some applications, the ceramic sealing cap may include an exposed head or an embedded socket head of a selected shape. In some applications, the ceramic sealing cap may include a hex-shaped head that allows opening and sealing of the rotor cylinder within a sample loading chamber during operation at high pressure, as detailed further herein. In some applications, the screw cap may be machined with the diamond grinding tool to include a smooth outer surface with a rounded shape that minimizes air resistance during spinning of the rotor, and an embedded socket head for opening and sealing the rotor cylinder during operation.

The purpose of the foregoing abstract is to enable the United States Patent and Trademark Office and the public generally, especially the scientists, engineers, and practitioners in the art who are not familiar with patent or legal terms or phraseology, to determine quickly from a cursory inspection the nature and essence of the technical disclosure of the application. The abstract is neither intended to define the invention of the application, which is measured by the claims, nor is it intended to be limiting as to the scope of the invention in any way.

BRIEF DESCRIPTION OF THE DRAWINGS

FIGS. 2a-2c show different views of another embodiment of the present invention.

FIGS. 7a-7f illustrate an exemplary process and tool for diamond milling U-shaped threads into high mechanical strength ceramic rotor cylinders and threaded screw caps suitable for high temperature, high pressure MAS NMR rotors of the present invention.

DETAILED DESCRIPTION

New high pressure, high temperature MAS NMR rotors are described for generating high-resolution NMR spectra at high pressures and high temperatures. The present invention overcome problems associated with conventional MAS instrument designs. The following description includes a best mode of the present invention. While the present invention is susceptible of various modifications and alternative constructions, it should be understood that there is no intention to limit the present invention to specific forms disclosed herein, but, on the contrary, the present invention is to cover all modifications, alternative constructions, and equivalents falling within the scope of the present invention as defined in the claims. Therefore the present description should be seen as illustrative and not limiting. The terms "high pressure" and "high temperature" as used herein mean the MAS NMR rotors can sustain a combined pressure of at least up to about 200 atmospheres (atm) and a temperature of at least up to about 300° C. during operation with low penetration losses when a sample is sealed within the sample compartment, as compared to rotors with plastic bushings. "Penetration loss" refers to losses in pressure stemming from penetration by internal gases from the sample compartment to the exterior environment during operation. In embodiments described herein, plastic bushings employed previously in the art are not used due to both the softening of the plastics that reduces their strength at high temperature, and the reduced ability of these plastics to withstand high pressures at these high temperatures. In some embodiments, ceramic inserts may be constructed of machinable ceramics such as MACOR®. In some embodiments, rotors and screw caps may be constructed of high mechanical strength ceramics such as zirconia that are fabricated with diamond milling tools described herein. O-rings used to seal samples within the rotor cylinder may be placed outside the sample compartment to minimize contact with hot elements of the MAS NMR rotor during operation. Exemplary designs of the present invention make possible a variety of combined high temperature, high pressure MAS NMR experiments that were not previously possible in the MAS NMR art. For example, in some embodiments, combined temperatures of at least up to about 300° C. and pressures up to at least about 50 atm may be maintained in samples containing aqueous water suitable for various in-situ $^{13}$C NMR experiments.

Figures 1A, 1B, 1C:
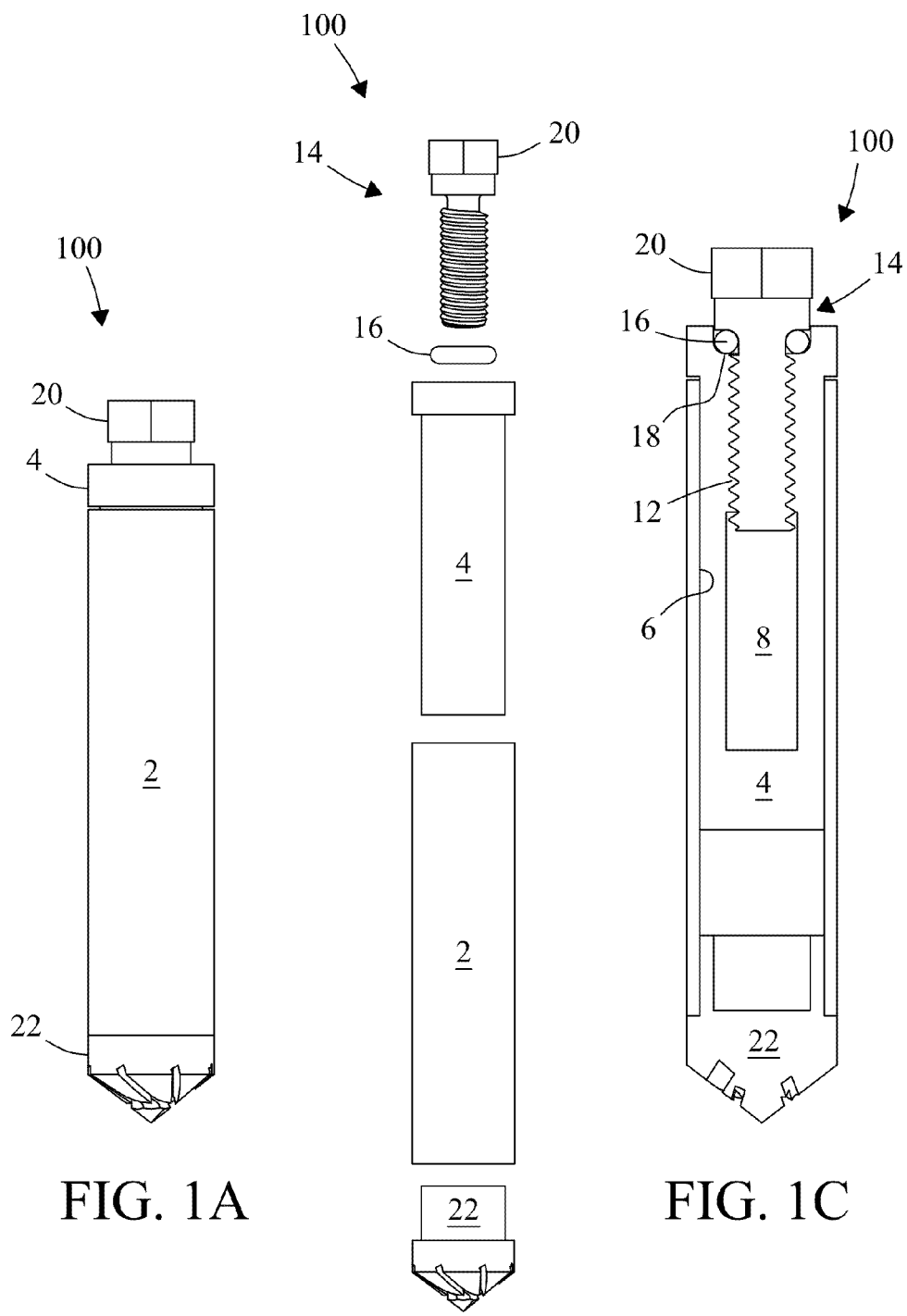
FIGS. 1a-1c show different views of one embodiment of the present invention.

FIGS. 1a-1c show different views of an exemplary high-pressure, high-temperature MAS NMR rotor 100 of the present invention. FIG. 1a shows the MAS NMR rotor 100 in assembled form. FIG. 1b is an exploded view showing components of MAS NMR rotor 100. FIG. 1c is a cross-sectional view showing components of MAS NMR rotor 100 in assembled form. In the figures, MAS NMR rotor 100 may include a rotor cylinder 2 available commercially (e.g., Revolution NMR, LLC, Fort Collins, Colo., USA) composed of a ceramic such as zirconia ($ZrO_2$) suitable for combined high temperature and high pressure applications. Rotor cylinder 2 may include various selected outer diameter (O.D.) dimensions including, but not limited to, e.g., 9.5 mm, 7.5 mm, 7.0 mm, 6.0 mm, 5.0 mm, 4.0 mm, or 3.2 mm. While a 9.5 mm O.D. dimension is described here, the present invention is not to be limited thereto. MAS rotor 100 may include a rotor cylinder (sleeve) insert 4 composed of a machinable ceramic such as MACOR® (Corning, Inc., Corning, N.Y., USA). Other ceramics may be employed provided the ceramic does not shatter at selected operating temperatures and pressures or while spinning MAS NMR rotor 100. Rotor cylinder insert 4 may include a smooth surface that can be introduced into rotor cylinder 2 along the length of the inner wall 6 (FIG. 1c) of rotor cylinder 2. Rotor cylinder insert 4 may be secured in place with a thin layer of a high-temperature glue such as high-temperature epoxy (e.g., Aremco-Bond 631-B-1108 epoxy, Aremco Products, Inc., Valley Cottage, N.Y., USA) positioned between the outer surface of rotor insert 4 and inner wall 6 of rotor cylinder 2 that prevents release of the rotor sleeve insert 4 from the rotor cylinder 2 during sample spinning. The epoxy layer is sufficiently thin so that the $^{13}C$ NMR background signal is negligible.

Rotor cylinder insert 4 when introduced into rotor cylinder 2 forms a sample compartment 8. Rotor cylinder insert 4 may include a single opening (not shown) at a top end of insert 4 through which a sample may be introduced into sample compartment 8 and sealed. Rotor cylinder insert 4 may include threads 12 that extend, e.g., from the opening (not shown) at the top end of cylinder insert 4 to the top of sample compartment 8. A threaded screw (sealing) cap 14 may be introduced through an O-ring 16 into the opening at the top of rotor cylinder insert 4 and screwed into threads 12 of rotor cylinder insert 4. When secured into position, screw (sealing) cap 14 compresses O-ring 16 onto an O-ring support or platform 18 machined at the top end of rotor cylinder insert 4 away from sample compartment 8 that seals a sample within sample compartment 8. O-ring support or platform 18 prevents exposure of O-ring 16 to highest temperatures typically found within sample compartment 8 that could soften O-ring 16. Screw (sealing) cap 14 may include, e.g., a hex-shaped head 20 that engages with a tool in a sample loading chamber described further herein during operation at high pressure and high temperature to assist opening and sealing of rotor 100 therein. Shapes of the head and tool are not limited.

Screw (sealing) cap 14 may include or be composed of high-temperature plastics. High-temperature plastics include, but are not limited to, e.g., polyether ether ketone polymers (e.g., PEEK®, Victrex USA, Inc., West Conshohocken, Pa., USA); polyimide-based polymers (e.g., VESPEL®, Dupont, Wilmington, Del., USA); and polyamide-imide polymers (e.g., TORLON®, Solvay Advanced Polymers, L.L.C., Alpharetta, Ga., USA), but plastics selected for use are not intended to be limited. O-ring 16 may include, or be composed of, high-performance perfluoroelastomers (e.g., Model Z1028 MARKEZ® Perfluoroelastomers, Marco Rubber, Seabrook, N.H., USA) or other suitable elastomers. Dimensions of O-ring 16 are not limited. In some embodiments, e.g., for a 9.5 mm (O.D.) rotor, O-ring 16 may have a dimension of, e.g., 7 mm (O.D.)×1.0 mm (i.e., cross-section), but sizes are not intended to be limited. Screw cap 14 may include a head 20 of various shapes that allow opening and closing of sample compartment 8 at high-temperature, high-pressure conditions during operation, as detailed further herein. In the instant embodiment, head 20 of screw (sealing) cap 14 may be a hex-shaped head 20, but shapes are not limited, as detailed further herein. Corners of O-ring support 18 and screw cap 14 are rounded to increase the strength of O-ring support 18 and screw cap 14 that prevents cracking of these components during operation.

MAS NMR rotor 100 may further include a spin tip 22 composed of, e.g., polychlorofluoropolymer plastics including polychlorofluorethylene (PTCFE) (e.g., KEL-F®, 3M Corp., St. Paul, Minn., USA]. Spin tips are commercially available (e.g., Revolution NMR, LLC, Fort Collins, Colo., USA). No limitations are intended.

FIG. 2a shows a perspective view of another exemplary high-pressure and high-temperature MAS rotor 200 of the present invention in assembled form. FIG. 2b shows an exploded view of components of rotor 200. FIG. 2c shows a cross-sectional view of rotor 200 in assembled form. In the figures, MAS rotor 200 may include a reusable, commercially available rotor cylinder 2 that includes or is constructed of a ceramic such as zirconia suitable for combined high temperature, high pressure applications. Rotor cylinder 2 may include various width (O.D.) dimensions described herein which are not limited. In one exemplary embodiment, rotor cylinder 2 may be of a cylindrical design with an outer diameter (O.D.) of about 9.5 mm and an internal diameter (ID) of about 7.8 mm. Two ceramic plugs 24 and 26 made of a machinable glass ceramic such as MACOR® may be introduced through openings (not shown) at respective ends of rotor cylinder 2. Circular grooves 32 and 34 may be machined along the length of the inner wall 6 above and below the position selected for sample compartment 8 of rotor cylinder 2. Circular grooves 36 and 38 may also be machined on the outside surface of plugs 24 and 26 to create a rough surface. A thin layer of high-temperature glue such as high-temperature epoxy (e.g., Aremco-Bond 631-B-1108 epoxy, Aremco Products, Inc., Valley Cottage, N.Y., USA) may be applied to circular grooves 36 and 38 on the outside surface of plugs 24 and 26 immediately prior to assembly of MAS rotor 200 that when introduced into rotor cylinder 2 secures ceramic plugs 24 and 26 in position on circular grooves 32 and 34 above and below the sample compartment 8. High-temperature glue may then be allowed to cure. When glued into position, ceramic plugs 24 and 26 form the ceiling 40 and floor 42 of sample compartment 8. In the instant embodiment, sample compartment 8 in assembled rotor 200 may include a sample volume of about ~500 µL. However, volumes of sample compartment 8 are not limited. For example, volumes may be tailored by selection of the width (O.D.) and length dimensions of rotor cylinder 2 and position of ceramic plugs 24 and 26 in rotor cylinder 2. Volumes of sample compartment 8 are larger than those in rotors that employ a ceramic insert (FIG. 1).

Figure 5A:
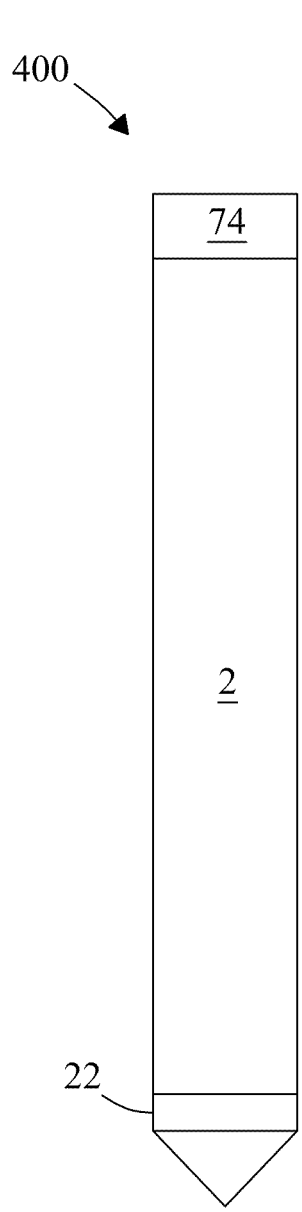
FIGS. 5a-5b show different views of yet another embodiment of the present invention.
Figure 5B:
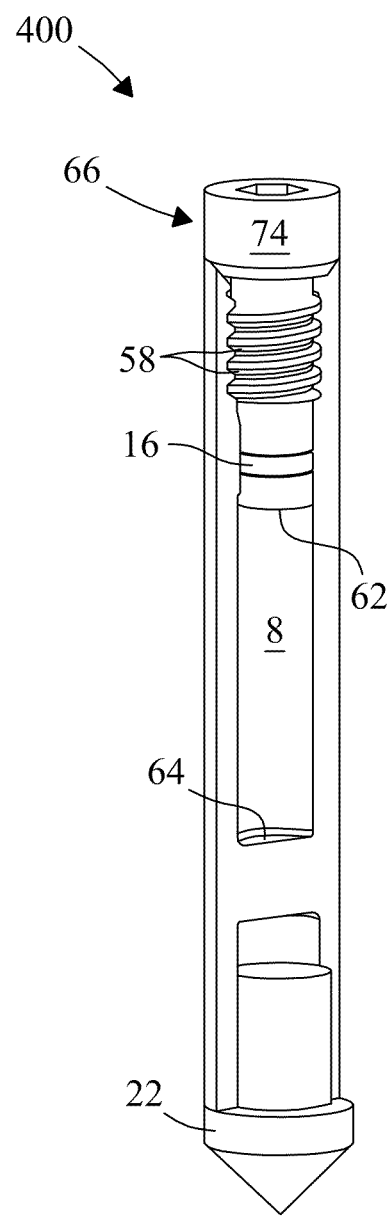

A threaded screw (sealing) cap 14 may be introduced through an O-ring 16 and screwed into matching threads 44 of top ceramic plug 24, that secures screw cap 14 into position and compresses O-ring 16 onto a platform support 46 machined at the top end of ceramic plug 24 above sample compartment 8 which seals a sample within sample compartment 8. Screw cap 14 may include an exposed or protruding head 20 of various non-limiting shapes (e.g., a hex-shaped head) that engages with a tool in a sample loading chamber described further herein at high pressure to assist opening and sealing of rotor 200 during operation. Shapes of the head and tool are not limited. In some embodiments, screw cap 14 may include a socket head of various non-limiting shapes (e.g., a hex-shaped socket head) described further in reference to FIG. 5b. Screw cap 14 may be constructed of a high-temperature plastic such as to PEEK, VESPEL, TORLON, and like materials. O-ring 16 may be constructed of, e.g., perfluoroelastomers, or other elastomer materials suitable for high-temperature, high-pressure operation. Dimensions of O-ring

16 are not limited. Rotor of the instant design are suitable for operation at combined high temperatures of at least up to about 250° C. and high pressures at least up to about 10 atm during operation.

Figures 3A, 3B, 3C:
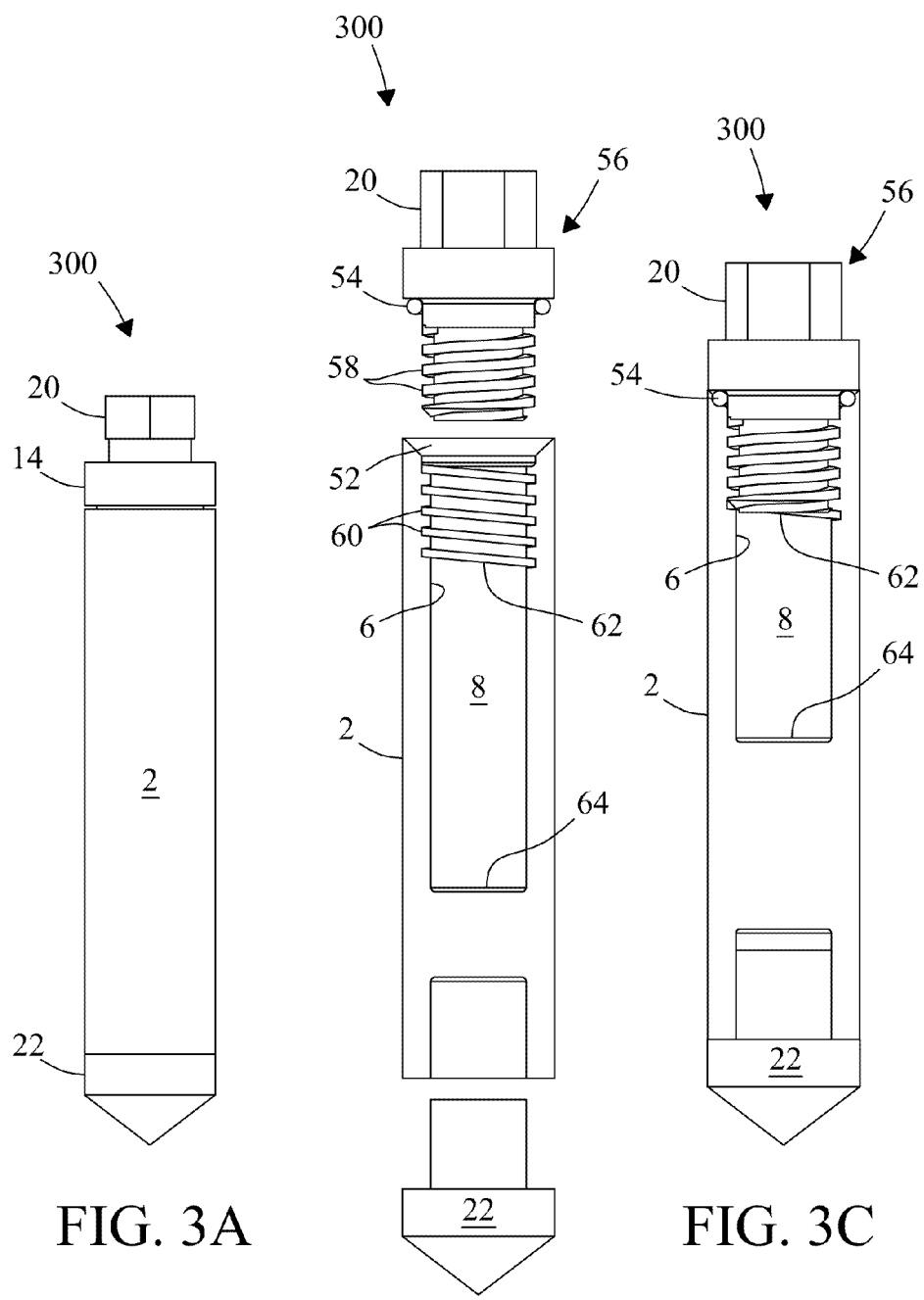
FIGS. 3a-3c show different views of yet another embodiment of the present invention.

FIG. 3a shows another exemplary high temperature, high pressure MAS NMR rotor 300 of the present invention in assembled form. An exemplary 9.5 mm (O.D.) rotor is described. FIG. 3b shows an exploded view of components of rotor 300. FIG. 3c shows a cross-sectional view of rotor 300 in assembled form. In the figures, MAS rotor may include a reusable rotor cylinder 2 composed of a high mechanical strength ceramic such as zirconia. Rotor cylinder 2 may be of a cylindrical design and machined from a single block of zirconia ceramic using custom designed diamond tools described further herein. Rotor cylinder 2 may include outside diameters (O.D.) of, e.g., 9.5 mm, 7.5 mm, 6.0 mm, 4.0 mm, 3.2 mm, 1.6 mm, but O.D. values are not limited. Rotor cylinder 2 may include an opening (not shown) at the top end of rotor cylinder 2 with an inner bore 8 machined to a selected depth that defines a sample compartment 8 that includes an integrated floor 64 of sample compartment 8. In the instant design, sample compartment 8 is integrated with rotor cylinder 2. Volumes of the sample compartment 8 are not limited. Rotor cylinder 2 may include an O-ring support 52 with a beveled shape at the top end of rotor cylinder 2 that surrounds opening and seats an O-ring 54.

Rotor cylinder 2 may include custom threads 60 of a U-shaped thread design or a modified sharp-V thread design that include rounded corners that enhances the strength of the threads and prevents fracture of the rotor cylinder at high temperatures and high pressures. Threads 60 may be machined at selected positions along the length of the inner wall 6 using a diamond milling tool. Threads 60 may extend from opening at the top end of rotor cylinder 2 to a selected depth within inner bore 8. In the exemplary embodiment, the 9.5 mm (O.D.) rotor 300 may have threads 60 with a depth in inner wall 6 of about 127 µm. Pitch distance between two adjacent threads 60 may be about 793.75 µm. But, thread depth and pitch distance are not intended to be limited thereto.

A threaded ceramic screw (sealing) cap 56 constructed of a high mechanical strength ceramic such as zirconia includes custom threads 58 that match threads in rotor cylinder 2. Screw (sealing) cap 56 may be introduced through O-ring 54 into the opening and screwed into threads 60 at the top end of rotor cylinder 2. When threaded into position, screw cap 14 seats high-temperature beveled O-ring 54 onto O-ring support 52 around the opening that forms a ceiling 62 in sample compartment 8 and seals a sample within sample compartment 8. Threaded screw cap 14 may include an exposed or protruding head 20 or a socket head (described further in reference to FIG. 5b) of various non-limiting shapes (e.g., hex-shaped) that engages with a tool in a sample loading chamber described further herein that allows opening and sealing of rotor 300 at high pressures. Shapes of the head and tool are not limited. In exemplary tests, 9.5 mm (O.D.) and 7.5 mm (O.D.) MAS NMR rotors 300 have been successfully tested at a combined temperatures at least up to about 240° C. and pressures at least up to about 32 atm at sample spinning rates of 3.0 kHz (9.5 mm rotor) and 5.0 kHz (7.5 mm rotor), respectively, at limits of current supply equipment. However, the instant design is expected to withstand combined temperatures at least up to about 300° C. and pressures at least up to about 200 atm. No limitations are intended.

Figures 4A, 4B, 4C:
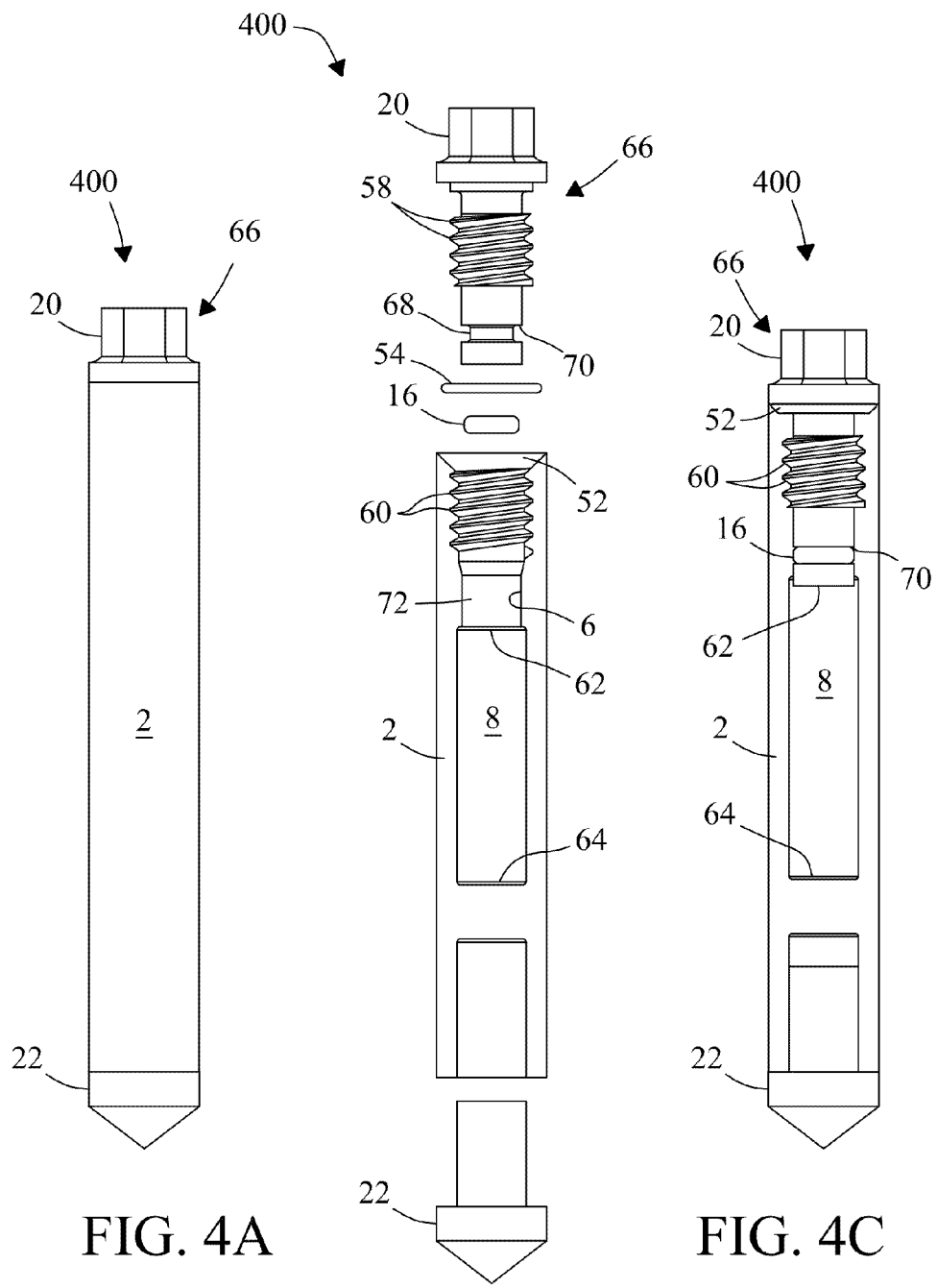
FIGS. 4a-4c show different views of still yet another embodiment of the present invention.

FIG. 4a shows another exemplary high temperature, high pressure MAS NMR rotor 400 of the present invention in assembled form. An exemplary 5 mm (O.D.) rotor 400 is described. FIG. 4b shows an exploded view of components of rotor 400. FIG. 4c shows a cross-sectional view of rotor 400 in assembled form. In the figures, rotor 400 includes various components described previously in reference to FIG. 3. Rotor cylinder 2 may include an opening 50 at the top end of rotor cylinder 2 with an inner bore 8 machined to a selected depth that defines an integrated sample compartment 8 with an integrated floor 64. Rotor cylinder 2 includes an O-ring support 52, e.g., of a beveled shape at the top end of rotor cylinder 2 that surrounds an opening (not shown) that seats an O-ring 54. In the figure, rotor cylinder 2 includes custom threads 60, e.g., of a modified sharp-V thread design with corners that are rounded to increase the strength of the threads and to prevent cracking of the rotor cylinder at high temperatures and pressures. Threads 60 may be machined at selected positions along the length of the inner bore 8 using a diamond milling tool. Threads 60 may extend from the opening at the top end of rotor cylinder 2 to a selected depth within inner bore 8. Thread depth and pitch distance are not limited.

A threaded ceramic screw (sealing) cap 66 of a dual O-ring design includes custom threads 58 that match those of rotor cylinder 2. Screw (sealing) cap 66 may be introduced through O-ring 54 into the opening and screwed into threads 60 at the top end of rotor cylinder 2. When threaded into position, screw cap 66 seats high-temperature O-ring 54 (a first O-ring) onto O-ring support 52 around the opening that forms a ceiling 62 in sample compartment 8 and seals a sample within sample compartment 8. Threaded screw (sealing) cap 66 may include a second high-temperature O-ring 16 that positions in a groove 68 near an end along the length of ceramic sealing screw 66 that inserts adjacent and proximate sample compartment 8 when introduced into rotor cylinder 2. Position of second O-ring 16 eliminates dead volumes in spaces located between threads 60 of rotor cylinder 2 and threads 58 of sealing cap 66 that can trap small quantities of samples, fluids, or gases during operation at high temperatures and high pressures. Sealing provided by second O-ring 16 may be obtained, e.g., as the top end of second O-ring 16 is compressed against an upper boundary 70 of groove 68 and against a section 72 of inner wall 6 configured with an expanded wall thickness of varying dimensions that is positioned immediately above, and proximate or adjacent to, the top of sample compartment 8. Threaded screw cap 66 may include an exposed or protruding hex-shaped head 20 or a hex-shaped socket head (described further in reference to FIG. 5b) that engages with a tool introduced into a sample loading chamber that allows opening and sealing of rotor 400 at high pressures. In some embodiments illustrated in FIGS. 5a-5b, screw cap 66 may include a hex-shaped socket head 74 with a smooth exterior surface. Other components illustrated in the figures have been described previously in reference to FIGS. 4a-4c.

Diamond Tools for Milling of High-Strength Ceramic Components

Figures 6A, 6B:
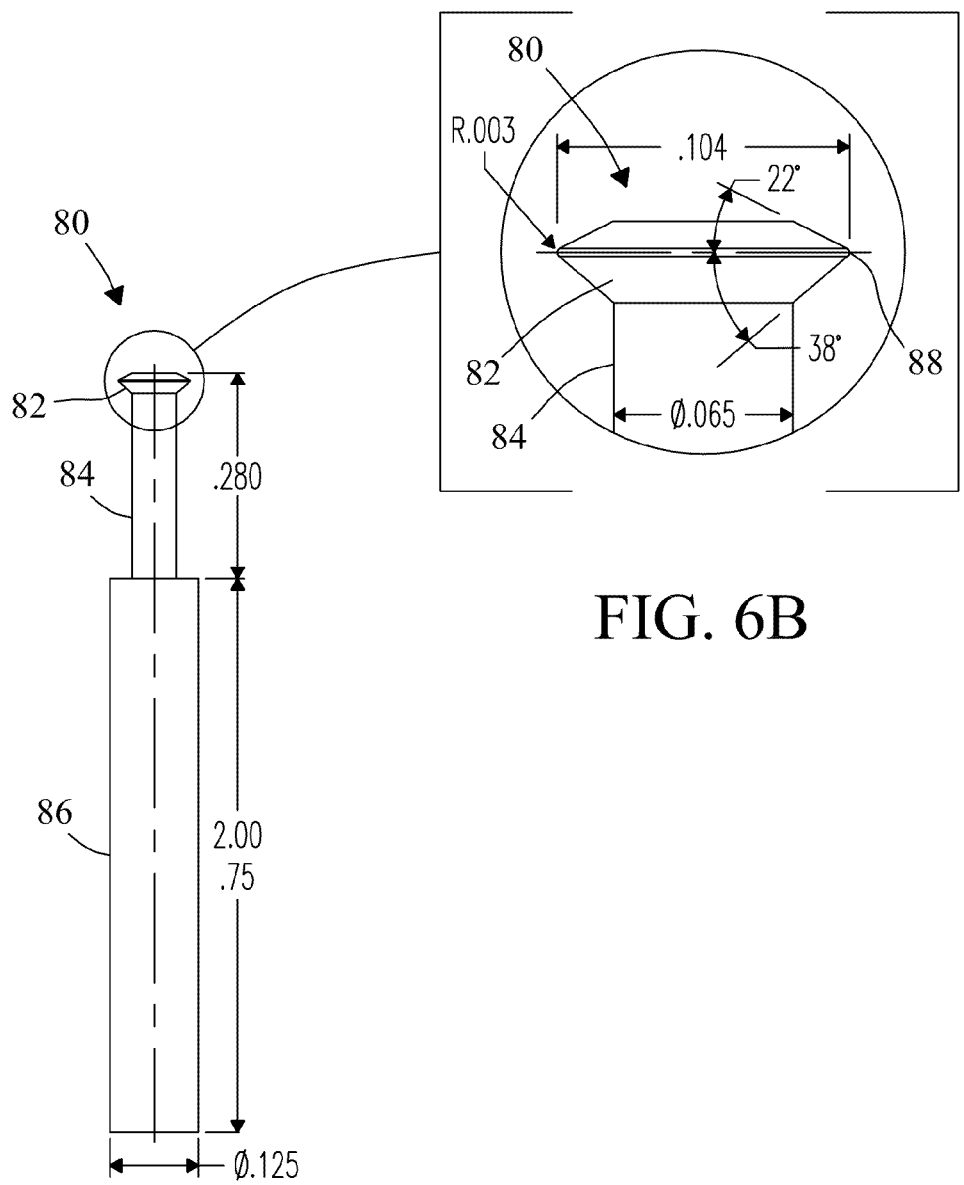
FIGS. 6a-6g illustrate an exemplary process and tool for diamond milling sharp-V-shaped threads into high mechanical strength ceramic rotor cylinders and threaded screw caps suitable for high temperature, high pressure MAS NMR rotors of the present invention.

FIG. 6a illustrates an exemplary custom diamond milling and grinding tool 80 of a Burr design for cutting, milling, and/or grinding of high mechanical strength ceramic components, including, e.g., rotor cylinders, and threaded screw caps used in high temperature, high pressure MAS NMR rotors of the present invention. The grinding tool illustrated in the figure includes dimensions for fabrication of an exemplary 5.0 mm (O.D.) rotor cylinder. However, the tool is not limited to the exemplary dimensions.

Grinding tool 80 may include a rotatable diamond grinding head (head) 82 of a customized head design integrated on an extension rod 84 that is further integrated with a handle 86. Handle 86 may be mounted to a high-precision rotation control unit or air spindle (not shown) available commercially (e.g., a model ASTRO-E 400 NE52 rotation control unit, NSK Nakanishi, Inc., Kanuma, Japan) that provides rotation of head 82 in both the thrust and the radial directions at selected rotation speeds. Rotation speeds may be selected from about 10000 RPM to 40000 RPM while the ceramic block mounted on a lathe (either a rotor cylinder or a sealing screw) is rotated at a speed, preferably less than 100 RPM. Rotation speeds are selected that minimize heating of the selected ceramic component during milling and grinding. Head 82 of tool 80 may further grind custom internal and external thread dimensions. FIG. 6b shows an enlarged view of the rotatable diamond head (head) 82 with selected dimensions. Diamond head 82 may include a central grinding edge 88 that circumvolves diamond head 82. Grinding edge 88 may include a circumference and diameter larger than the top and bottom ends of head 82 so that grinding edge 88 may extend from head 82 and include selected grinding angles as shown suitable for grinding interior and exterior threads into the surfaces of high strength ceramic components. Thread shapes are not limited. In some embodiments, interior and exterior threads may be of a modified sharp-V screw thread type that are modified to include rounded inner thread corners that enhance the strength of the ceramic against cracking in the rotor cylinder under high pressure. As an example, using a 60 degree milling angle as a basis for modified sharp V-threads in an exemplary 5 mm (O.D.) MAS rotor, two angles (38° and 22°) shown in the figure give an angle difference of 16° (i.e., 38°-22°). Half of this angle difference (i.e., 8°) is equal to the offset angle shown in both FIG. 6c and FIG. 6d discussed hereafter. In general, the modified sharp-V threads include a half angle that is equal to the offset angle. The offset angle depends on both the pitch distance and the diameter of the ceramic components, as given by Equation [1] below. In the instant embodiment, thread angles are about 60 degrees, but thread angles are not intended to be limited. In some embodiments, interior and exterior threads may be of a U-shape design that enhance the strength of the ceramic against cracking in the rotor cylinder under high pressure. U-shapes may include shapes such as rounded squares, rounded rectangles, and other rounded shapes. No limitations are intended.

Figures 6C, 6D:
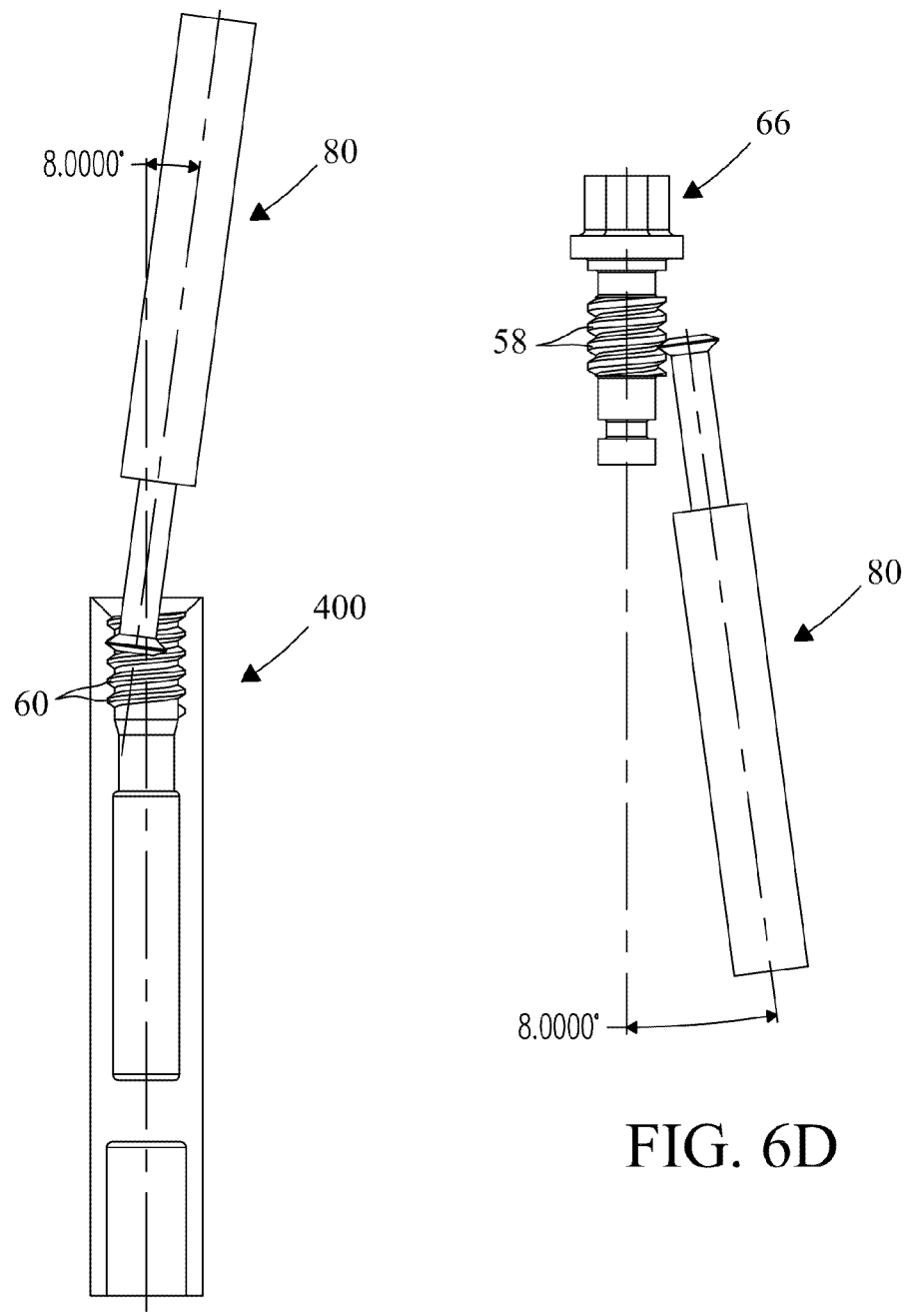

FIGS. 6c-6d illustrate an exemplary process of milling custom exterior threads 58 and interior threads 60 of high-mechanical strength ceramic rotor cylinders 2 and ceramic threaded screw caps 56 and 66 of an exemplary 5-mm (O.D.) MAS NMR rotors 300 and 400 using the diamond milling tool (described in reference to FIG. 6a). Milling of threads 58 and 60 may include selecting an offset angle (θ) for positioning diamond milling tool 80. Offset angle (θ) is given by Equation [1], as follows:

$$\tan(\theta) = d/D \quad [1]$$

Here, (D) is the outside diameter (O.D.) of exterior threads 58 of ceramic sealing caps 56 and 66. Interior threads 60 inside rotor cylinder 2 include the same dimension as the sealing caps 56 and 66; (d) is the thread pitch distance (i.e., 1 inch divided by the number of threads per inch) selected for exterior threads 58 of ceramic sealing caps 56 and 66 and interior threads 60 of rotor cylinder 2. As shown in the figures, milling tool 80 may be oriented at an offset angle (θ) of, e.g., eight degrees (8°) with respect to the central axis of rotor cylinder 2 and threaded screw caps 56 and 66 for milling threads in each of the selected components. Orientations and offset angles are exemplary of the instant embodiment only and are not intended to be limiting.

Figure 6E:
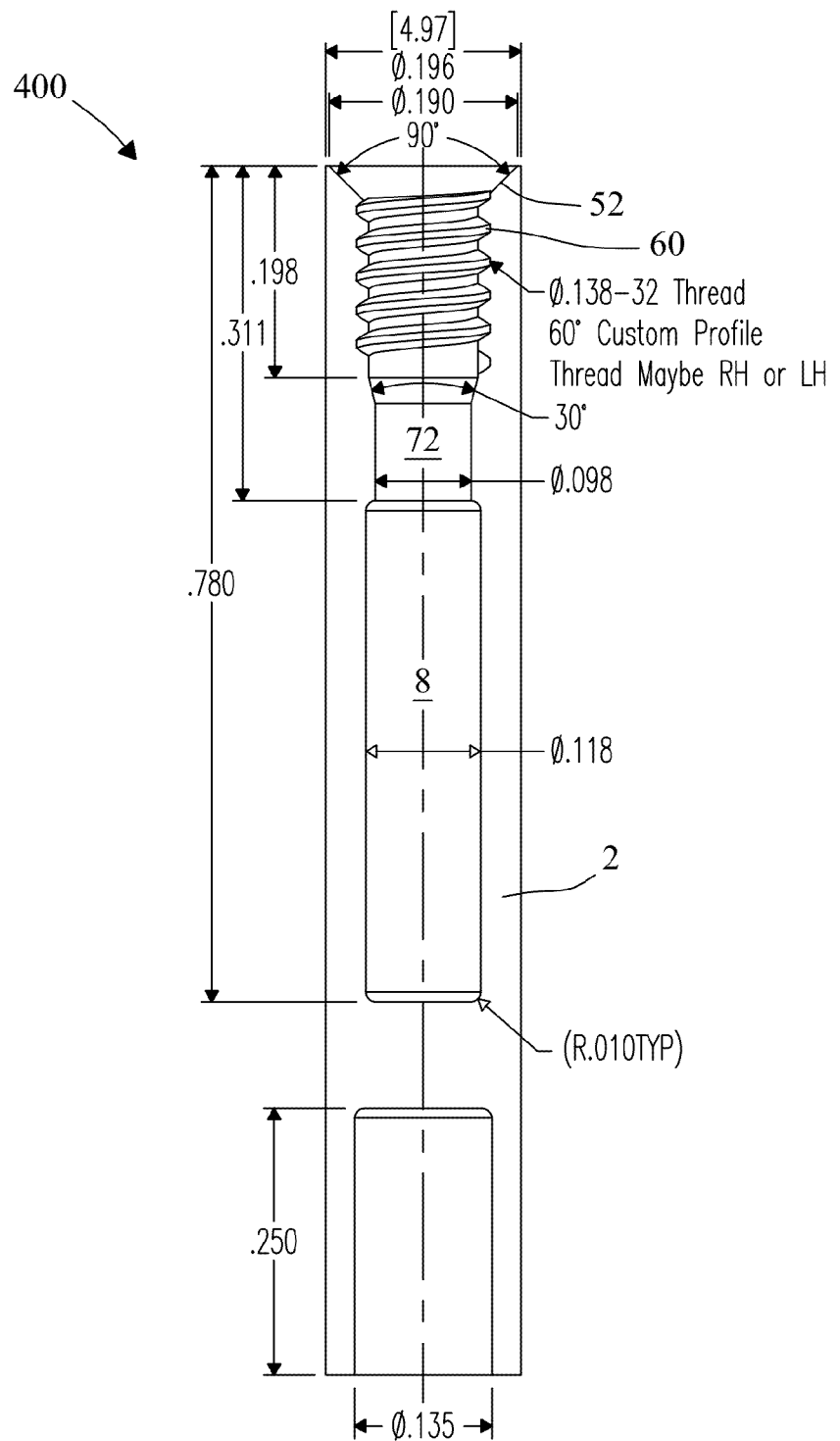
Figure 6F:
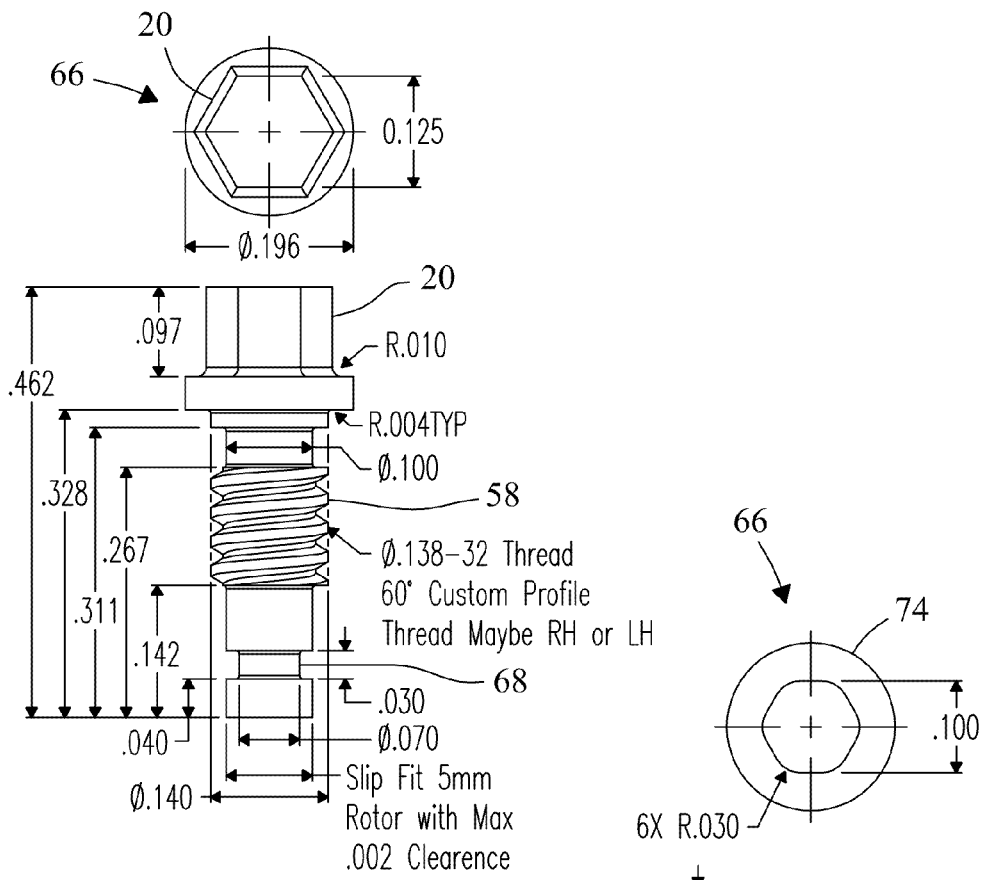
Figure 6G:
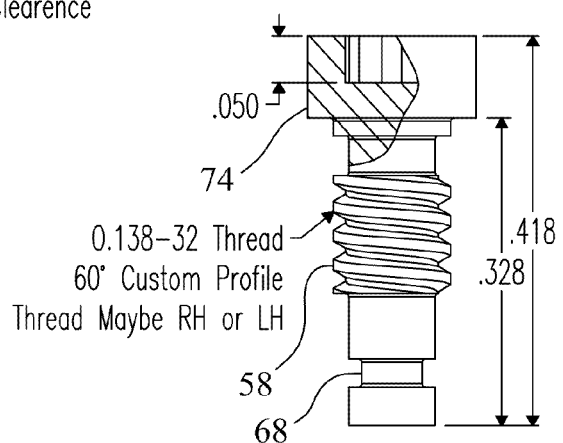

FIG. 6e shows dimensions for milling of, e.g., a 5.0 mm (O.D.) high-strength ceramic rotor cylinder 2 of an MAS NMR rotor 400 including custom internal threads (e.g., modified sharp-V threads) 60 with selected offset angles. Other components illustrated in the figure have been described previously in reference to FIGS. 4a-4c. FIGS. 6f-6g shows dimensions for milling of, e.g., a 5.0 mm (O.D.) high-strength ceramic threaded screw cap 66 of a hex head 20 design and a hex socket head 74 design for use in MAS NMR rotor 400 including custom exterior threads (e.g., sharp-V threads) 58. Other components illustrated in the figure have been described previously in reference to FIGS. 4a-4c.

Figure 7A:
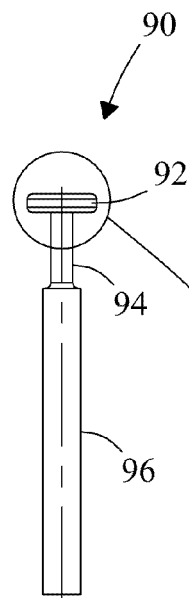
Figure 7B:
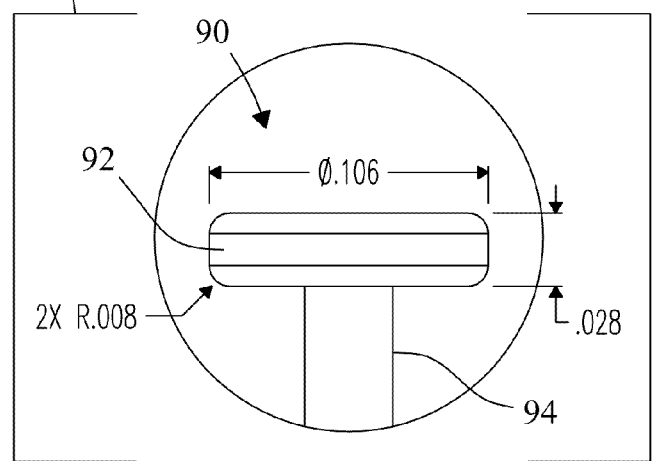

FIG. 7a shows dimensions of an exemplary custom diamond milling and grinding tool 90 of a Burr design for cutting, milling, and/or grinding of high mechanical strength ceramic components of an exemplary 7.5 mm (O.D.) rotor including, e.g., rotor cylinders, and threaded screw caps. However, the tool is not limited to the exemplary dimensions. Grinding tool 90 may include a rotatable diamond grinding head (head) 92 of a customized head design integrated on an extension rod 94 that is further integrated with a handle 96. Handle 96 may be mounted to a high-precision rotation control unit or air spindle (not shown) available commercially (e.g., a model ASTRO-E 400 NE52 rotation control unit, NSK Nakanishi, Inc., Kanuma, Japan) that provides rotation of head 92 in both the thrust and the radial directions at selected rotation speeds. Rotation speeds may be selected from about 10000 RPM to 40000 RPM while the ceramic block mounted on a lathe (either a rotor cylinder or a sealing screw) is rotated at a speed, preferably less than 100 RPM. Head 92 of tool 90 further cuts and grinds custom internal and external threads of a rounded square or rectangular type with custom selected dimensions. FIG. 7b shows an enlarged view of rotatable diamond head (head) 92. Dimensions of head 92 of the instant embodiment are shown.

Figure 7E:
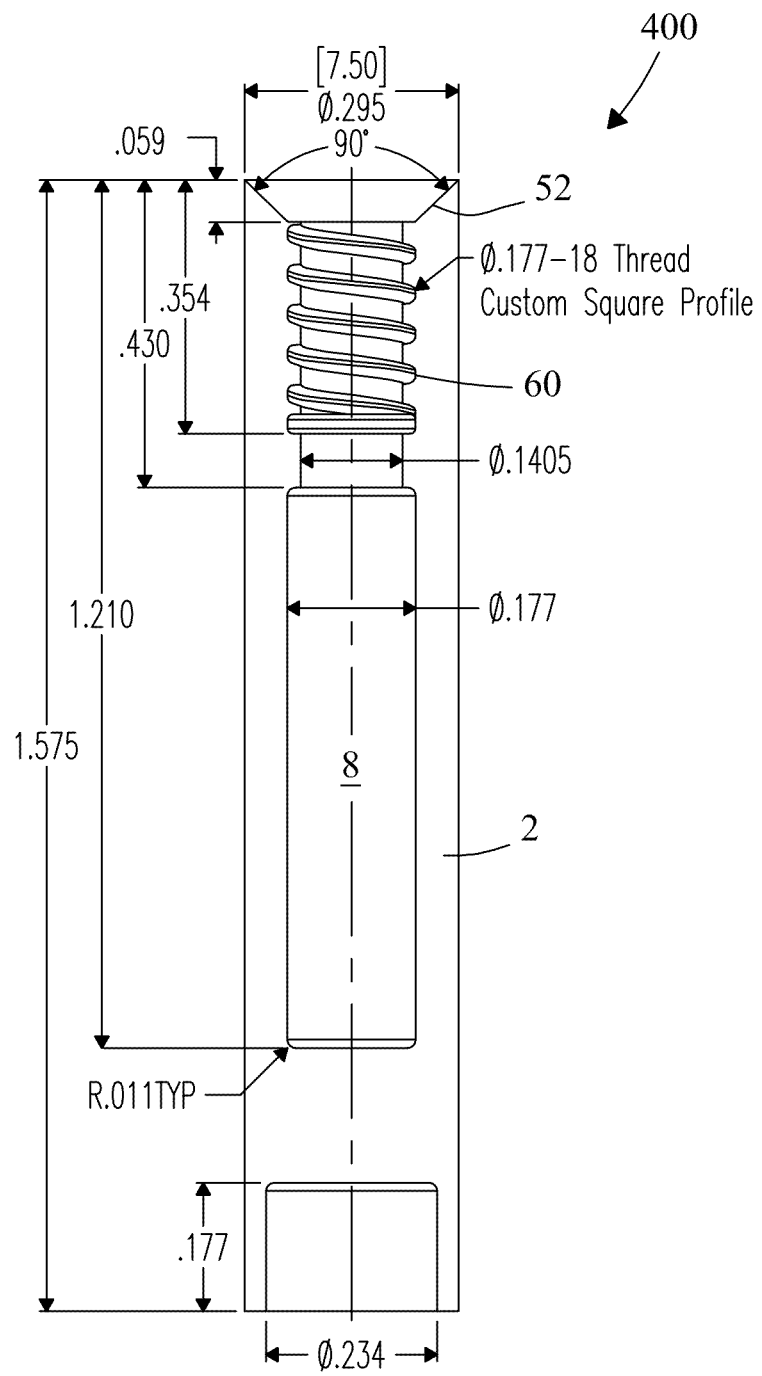
Figure 7F:
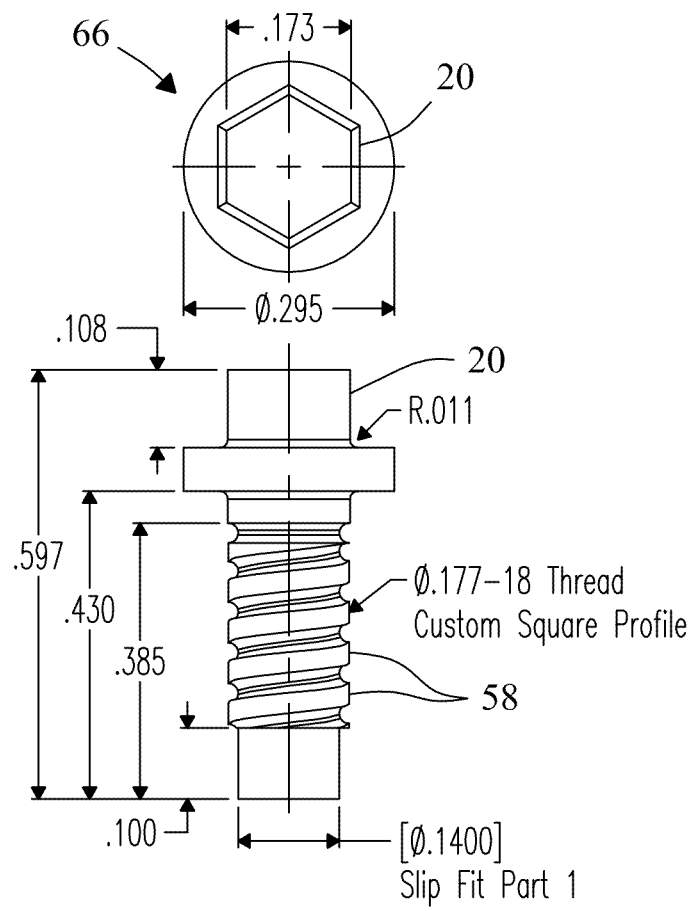

FIGS. 7c-7d illustrate the milling process for diamond milling custom interior threads 60 and exterior threads 58 into high mechanical strength ceramic rotor cylinders 2 of rotors 300 and 400 and threaded screw caps 56 and 66, respectively, using the diamond milling tool 90 described previously in reference to FIG. 7a. In the figures, milling tool 90 may be oriented at an offset angle (θ) given by Equation [1] of, e.g., 8.86 degrees with respect to the central axis of rotor cylinder 2 for rotors 300 and 400, and the threaded screw caps 56 and 66 to provide selected dimensions for milling threads in each of these respective components. Orientations and angles are exemplary of the instant embodiment and not intended to be limiting. FIG. 7e shows dimensions for milling of the 7.5 mm (O.D.) high-strength ceramic rotor cylinder 2 of MAS NMR rotor 400 including custom internal threads (e.g., U-shaped threads) 60 with respective angles. Other components illustrated in the figure have been described previously in reference to FIGS. 4a-4c. FIGS. 7f shows dimensions for milling of, e.g., a 5.0 mm (O.D.) high-strength ceramic threaded screw cap 66 with an extruded head 20 of a hex design and an embedded socket head 74 of a hex design for use in MAS NMR rotor 400. Screw cap 66 may include custom exterior threads (e.g., U-shaped threads) 58. Other components illustrated in the figure have been described previously in reference to FIGS. 4a-4c.

MAS NMR Spinning Rates

MAS NMR rotors of the present invention allow sample spinning rates greater than about 1 Hz. Spinning rates are not limited. In some embodiments, the high-pressure, high-temperature rotors provide a sample spinning rate between about 1 Hz and about 100 Hz. In some embodiments, the high-pressure, high-temperature MAS rotors provide a sample spinning rate between about 100 Hz and about 1 kHz. In some embodiments, the 9.5 mm high-pressure, high-temperature MAS rotor provides a sample spinning rate between about 1 kHz and about 3.0 kHz. In some embodiments, the 7.5 mm high-pressure, high-temperature MAS rotor provides a sample spinning rate up to about 5 kHz. In some embodiments, high-pressure MAS rotors with O.Ds less than about 7.5 mm allow sample spinning rates greater than about 5 kHz. In principle, the smaller the rotor O.D., the faster a sample spinning rate that can be achieved. Spinning rates described here are exemplary only.

Sample Loading of High Temperature, High Pressure MAS Rotors

A loading chamber detailed, e.g., by Hoyt et al. in US Patent Publication No.: 2012-0146636 may be used to load and seal fluids, gases, and other samples inside MAS rotors of the present invention at a high pressure at room temperature. The loaded rotor may then be transferred to a MAS NMR probe where temperature of the MAS rotors may be increased while positioned within the NMR magnet for in-situ MAS NMR studies.

Applications

High temperature, high pressure MAS rotors of the present invention find application in, e.g., catalyst studies, and other applications where high temperatures greater than 100° C. at significantly elevated pressures above about 1.0 atm are employed, e.g., as detailed in the following Example.

EXAMPLE

Alkylation of Cyclohexanol

In an exemplary catalyst reaction study, $^{13}$C MAS NMR studies on the alkylation of cyclohexanol, a key step in the hydroalkylation pathway, were carried out in-situ. Reaction dynamics/kinetics and role of water were explored using a heterogeneous mixture containing varied amounts of cyclohexanol-1-$^{13}$C and H-Beta zeolite (HBEA) as a function of reaction temperature (up to 163° C.) and reaction time (up to 48 hours). Such analyses can provide such parameters as kinetics and Keq values, provide insights into mechanisms for dehydration including differentiating species adsorbed on the catalyst surface, and species present in the aqueous phase.

Figure 8:
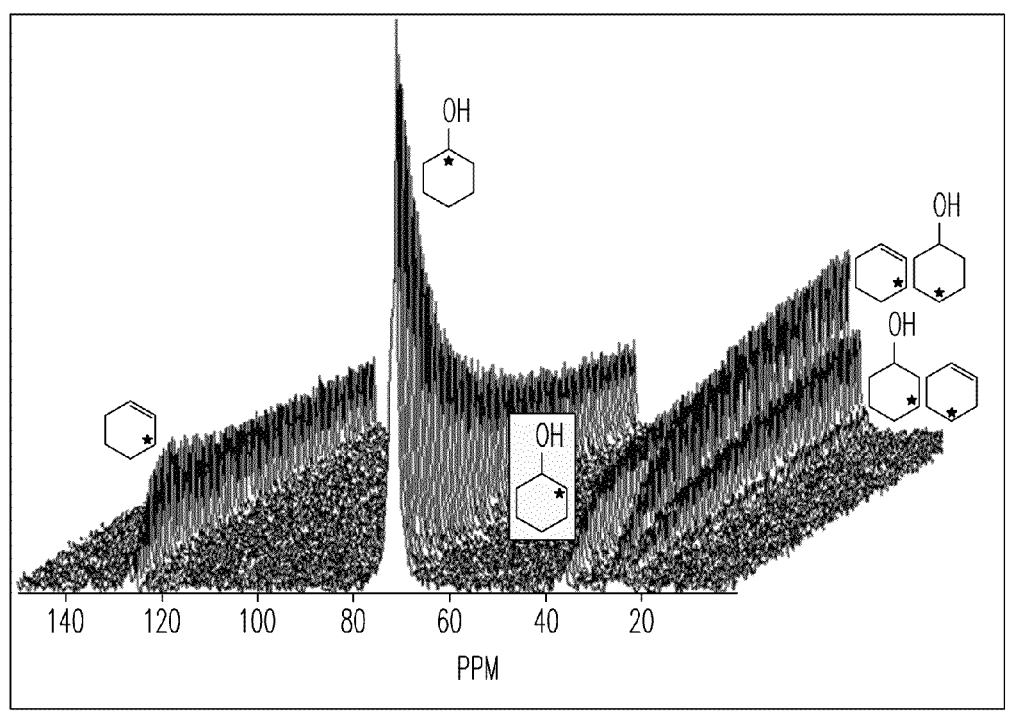
FIG. 8 is a plot showing in-situ $^{13}$C MAS NMR spectra acquired on a selected sample mixture as a function of time at high pressure and high temperature conditions.
Figure 9A:
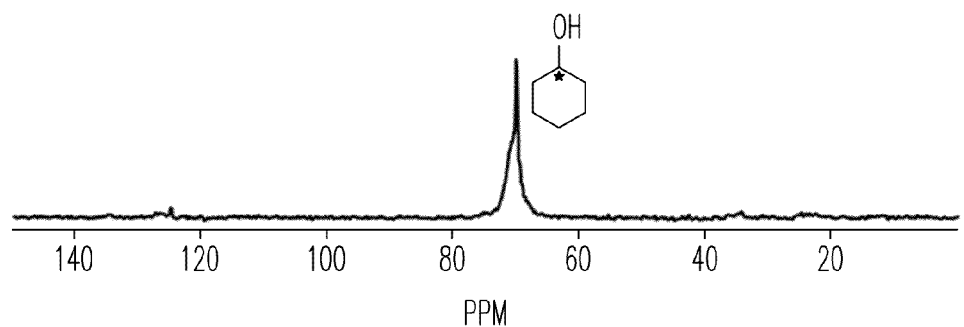
FIGS. 9a-9d show individual spectra taken from the collection of FIG. 8 showing reactants and reaction products in the MAS NMR rotor as a function of time at high pressure, high temperature conditions.
Figure 9B:
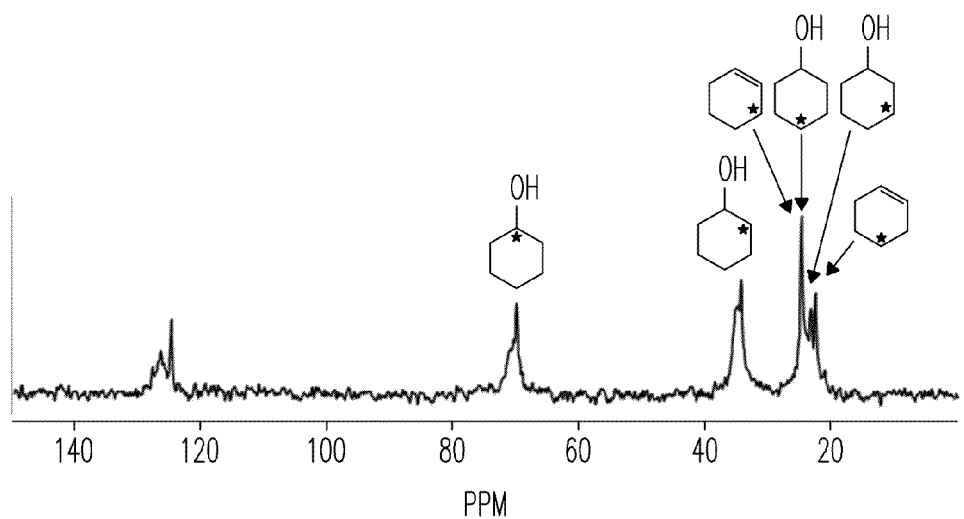
Figure 9C:
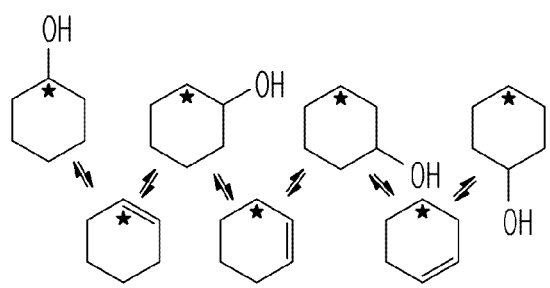
Figure 9D:
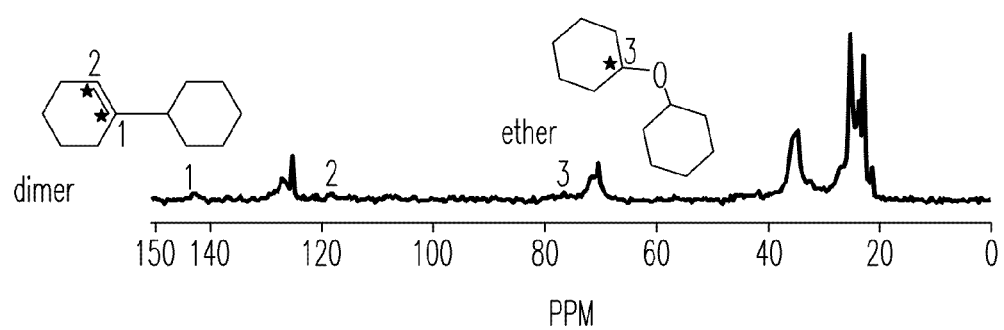

FIG. 8 is a plot showing a series of 80 individual $^{13}$C MAS (2.4 kHz) NMR spectra (11.7 T) collected in-situ on a mixture of HBEA (22 mg) and cyclohexanol-1-$^{13}$C (120 μL of 0.33 M) at a high reaction temperature of 163° C. and a high reaction pressure of ~7 atm as a function of time. Spectra were acquired using a recycle delay time of 5 seconds, an accumulation number of 256 scans, and at a sample spinning rate of 2.4 kHz. Acquisition time was approximately 0.29 hours for each spectrum. Quantitative analysis of the spectra in the figure as a function of reaction time yields reaction dynamics/kinetics. For example, relative fractions of both reactants and reaction products as a function of reaction time may be obtained, from which equilibrium constants ($K_{eq}$) and fraction constants ($K_f$) may be calculated. For the analysis, spectral de-convolution was performed first. Then, the integrated peak intensities for either the reactants or the products (e.g., both the species inside the aqueous phase and those in the surface phases) where obtained as a function of reaction time. Results yielded a ($K_{eq}$) value of 0.43 and a ($K_f$) value of $3.6 \times 10^{-5}$ $S^{-1}$. FIG. 9a shows a first spectrum taken at time zero from the collection in FIG. 8. A narrow peak at 70 ppm corresponds to cyclohexanol-1-$^{13}$C in the aqueous phase, and a broad peak centered at 70.8 ppm corresponds to the interaction of cyclohexanol-1-$^{13}$C with the H-Beta zeolite surface. Both peaks correspond to the $^{13}$C isotope of the oxygen-bonded carbon of cyclohexanol-1-$^{13}$C. FIG. 9b shows an 80$^{th}$ spectrum taken at a time of 22.4 hours into the reaction. A narrow peak at about 125 ppm corresponds to a reaction product in the aqueous phase identified as cyclohexene based on characteristic double bond carbon peaks. A second broad peak located at 126.6 ppm corresponds to the interaction of cyclohexene with the catalyst surface. FIG. 9c shows a migration of the $^{13}$C-labeled carbon isotope in the labeled cyclohexanol molecule during reaction. FIG. 9d shows appearance of new reaction products after a reaction time of 48 hours in the MAS NMR rotor at the same high-temperature (163° C.), high-pressure conditions (~7 atm). In the figure, a benzene dimer and a benzyl ether appear in the spectrum. These in-situ $^{13}$C MAS NMR data show that detailed reaction mechanisms including reaction pathways and reaction kinetics can be obtained for study of catalytic reactions as a function of time.

While a number of embodiments of the present invention have been shown and described, it will be apparent to those skilled in the art that many changes and modifications may be made without departing from the invention in its broader aspects. The appended claims are therefore intended to cover all such changes and modifications as fall within the scope of the present invention.

The invention claimed is:

1. A magic angle sample spinning (MAS) nuclear magnetic resonance (NMR) rotor, comprising:
    a rotor cylinder composed of a high mechanical strength ceramic with a first inner bore that defines an integrated sample compartment that spans the inner diameter of the rotor cylinder with threads disposed along the inner wall at the upper end of the sample compartment, and a second inner bore that defines an integrated compartment for mounting a spin tip disposed at an end of the rotor cylinder opposite the sample compartment; and
    a threaded sealing cap with threads that match the threads of the rotor cylinder, the threaded sealing cap is comprised of a high mechanical strength ceramic and configured to secure and compress at least two high temperature gaskets that seal the sample compartment;
    whereby the integrated sample compartment, gaskets and sealing cap when combined and secured maintain a pressure within the sample compartment of the rotor cylinder of at least up to about 200 atm and a temperature of at least up to about 300° C. without the use of a sealing adhesive.

2. The rotor of claim 1, wherein the rotor cylinder includes a gasket support disposed at an end of the rotor cylinder with a beveled well that supports one of the at least two sealing gaskets and surrounds the opening into the sample compartment of the rotor cylinder.

3. The rotor of claim 1, wherein the gaskets are O-rings and wherein the ceramic sealing cap includes a groove disposed at an end thereof that seats one of the dual O-rings in the rotor cylinder that prevents samples from entering into air gaps disposed between threads of the rotor cylinder and threads of the ceramic sealing cap.

4. The rotor of claim 1, wherein the ceramic sealing cap includes an exposed head or an embedded socket head of a selected shape that enables securing and opening of the sealing cap into or out of the rotor cylinder.

5. The rotor of claim 1, wherein the threads of the rotor cylinder and the sealing cap are U-shaped threads, or modified sharp-V threads.

6. The rotor of claim 5, wherein the modified sharp-V screw threads include a thread angle of about 60 degrees.

7. A magic angle sample spinning (MAS) nuclear magnetic resonance (NMR) rotor, comprising:
- a rotor cylinder composed of a high mechanical strength ceramic with a first inner bore that defines an integrated sample compartment that spans the inner diameter of the rotor cylinder with threads disposed along the inner wall at the upper end of the sample compartment, and a second inner bore that defines an integrated compartment for mounting a spin tip disposed at an end of the rotor cylinder opposite the sample compartment; and
- a threaded sealing cap with threads that match the threads of the rotor cylinder, the threaded sealing cap is comprised of a high mechanical strength ceramic and configured to secure and compress at least one high-temperature gasket that seals the sample compartment;
- whereby the integrated sample compartment, at least one gasket and sealing cap when combined and secured maintain a pressure within the sample compartment of the rotor cylinder of at least up to about 200 atm and a temperature of at least up to about 300° C. without the use of a sealing adhesive.

* * * * *